United States Patent [19]
Chia et al.

[11] Patent Number: 6,114,189
[45] Date of Patent: Sep. 5, 2000

[54] MOLDED ARRAY INTEGRATED CIRCUIT PACKAGE

[75] Inventors: Chok J. Chia, Cupertino; Seng-Sooi Lim, San Jose; Qwai H. Low, Cupertino, all of Calif.

[73] Assignee: LSI Logic Corp., Milpitas, Calif.

[21] Appl. No.: 08/927,704

[22] Filed: Sep. 10, 1997

[51] Int. Cl.$^7$ ................................................. H01L 21/44
[52] U.S. Cl. ........................ 438/112; 438/123; 438/124; 438/127
[58] Field of Search ..................... 438/112, 123, 438/124, 126, 127; 257/676, 787, 788; 361/760, 767

[56] References Cited

U.S. PATENT DOCUMENTS

| | | | |
|---|---|---|---|
| 4,822,550 | 4/1989 | Komaths | 438/126 |
| 5,355,283 | 10/1994 | Marrs et al. | 361/760 |
| 5,557,150 | 9/1996 | Variot et al. | 257/787 |
| 5,565,709 | 10/1996 | Fukushima et al. | 257/787 |
| 5,661,338 | 8/1997 | Yoo et al. | 257/676 |
| 5,731,231 | 3/1998 | Miyazima | 438/124 |
| 5,841,192 | 11/1998 | Exposito | 257/787 |
| 5,874,784 | 2/1999 | Aoki et al. | 257/787 |
| 5,886,398 | 3/1999 | Low et al. | 257/787 |
| 5,893,724 | 4/1999 | Chakravorty et al. | 438/124 |

*Primary Examiner*—Kevin M. Picardat

[57] ABSTRACT

One aspect of the invention relates to a semiconductor substrate. In one version of the invention, a semiconductor substrate includes a package substrate having first and second surfaces with conductive traces formed thereon and structures for providing electrical connection between selected conductive traces, a die attach area on the first surface of the package substrate adapted to provide physical connection to a semiconductor die, the die attach area having conductive contacts for providing electrical connection between the die and conductive traces on the first surface, a package frame, at least one substrate strap which connects the package substrate to the package frame, the substrate strap being formed integrally with the package substrate and the package frame.

18 Claims, 10 Drawing Sheets

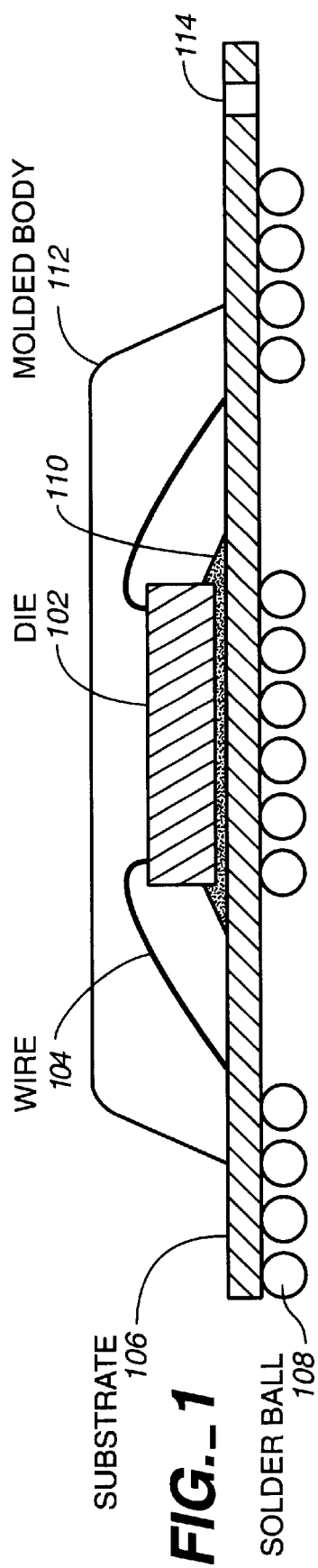
FIG._1
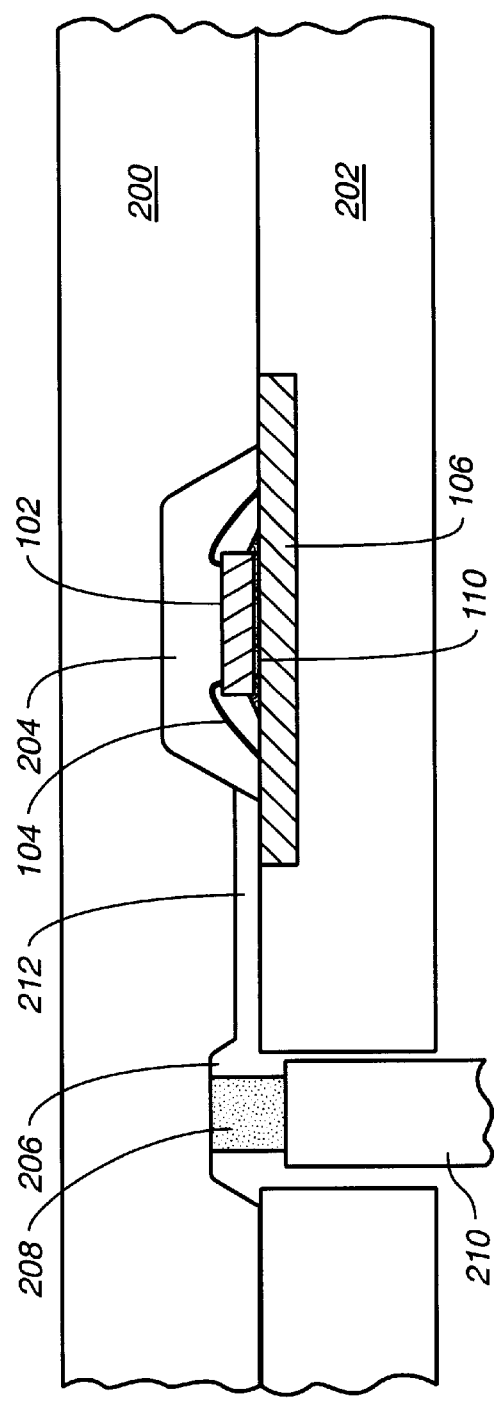
FIG._2

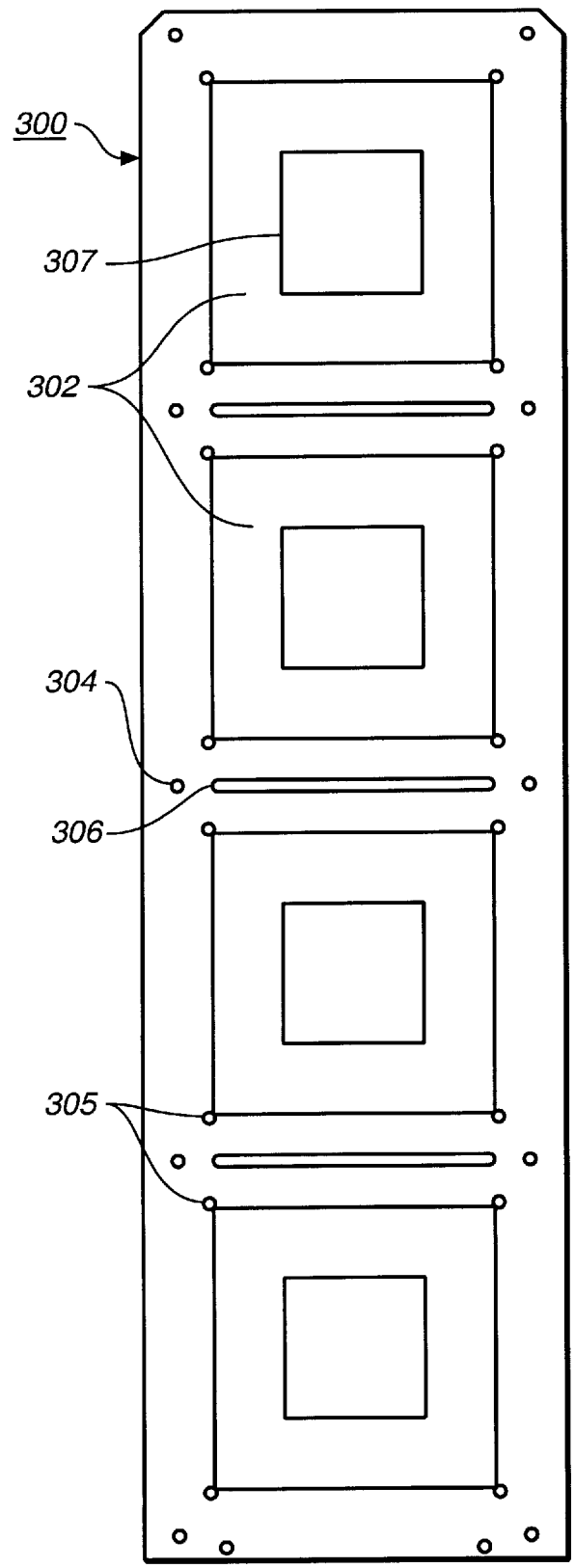
FIG._3A

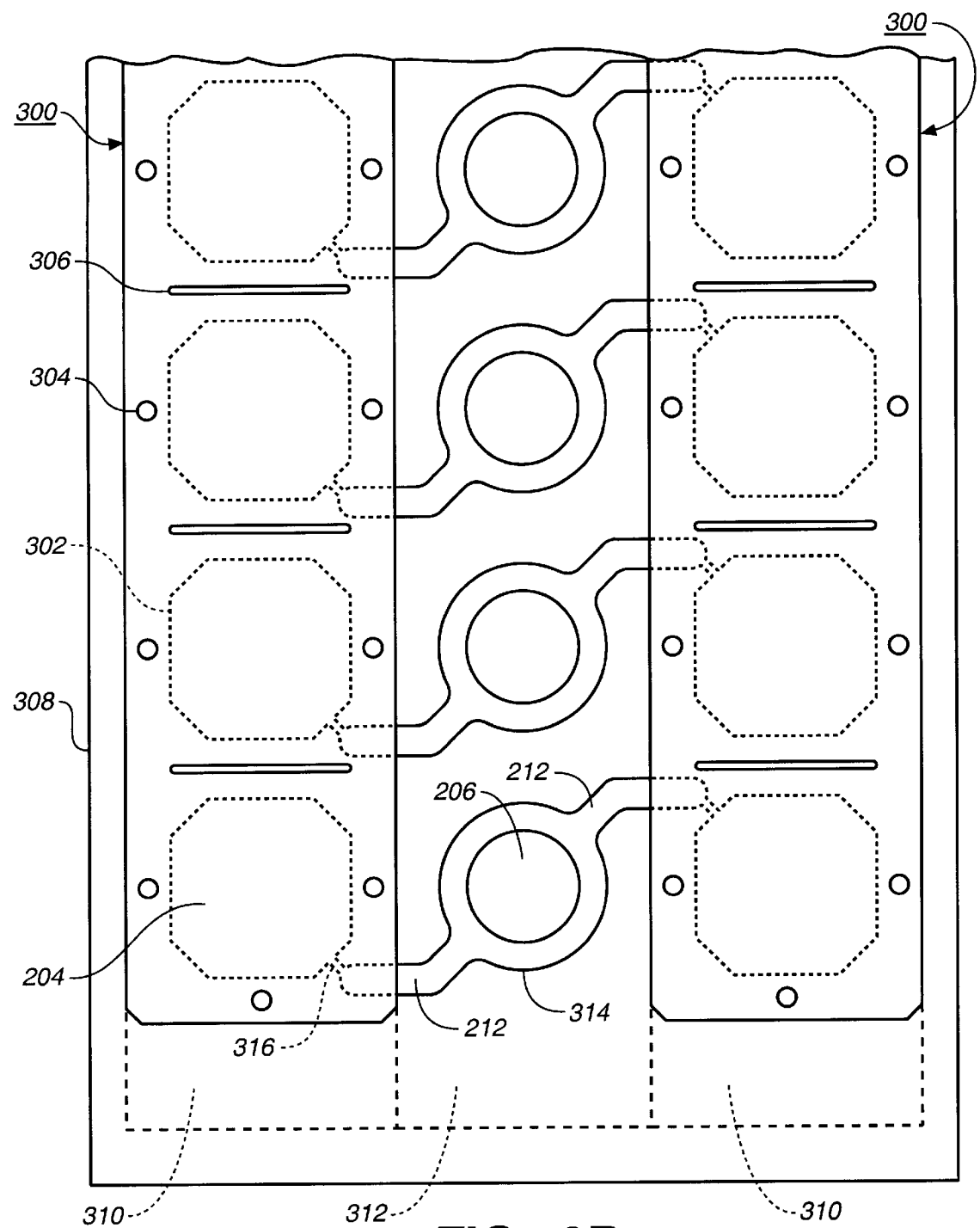
FIG._3B

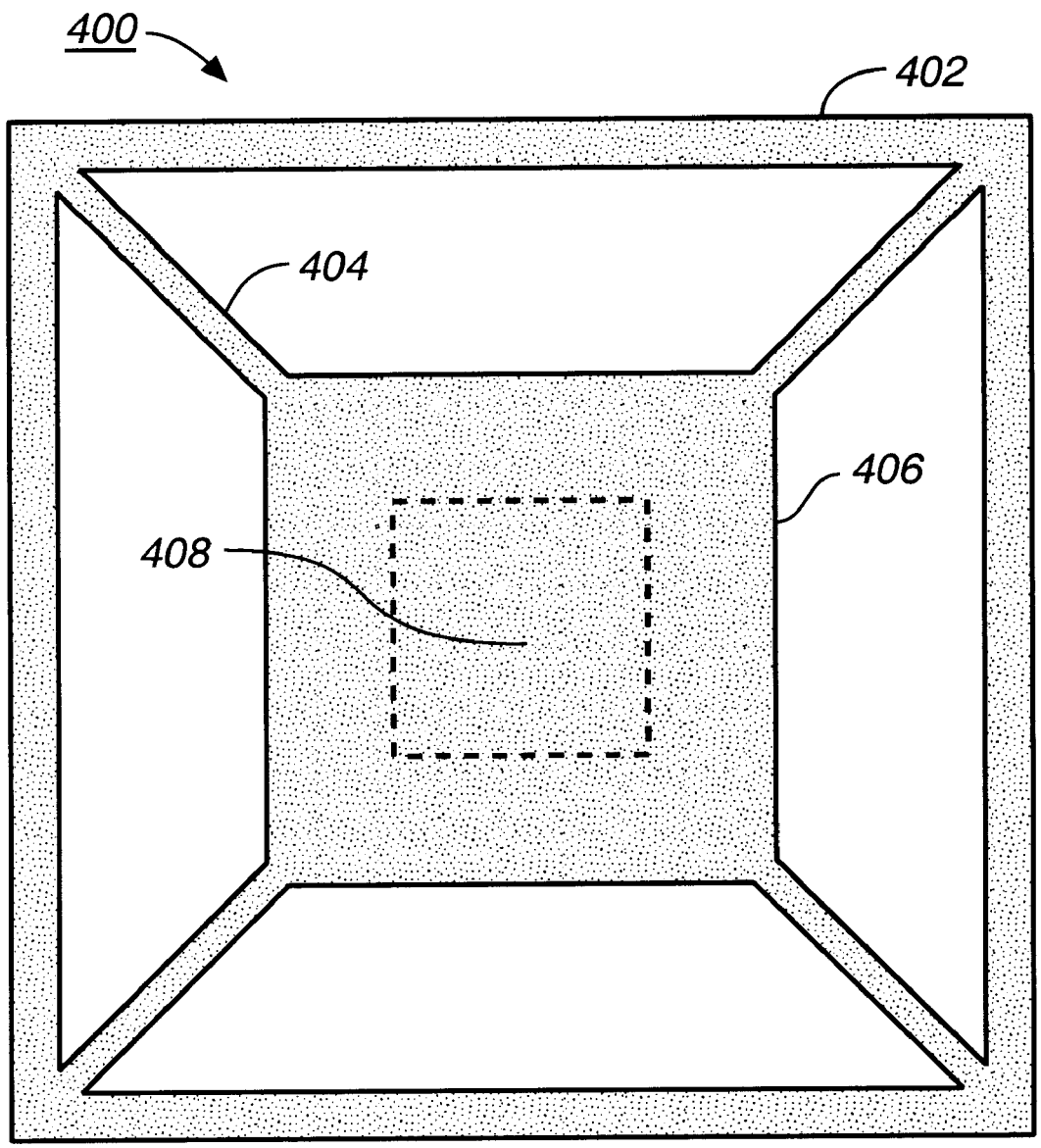
FIG._4

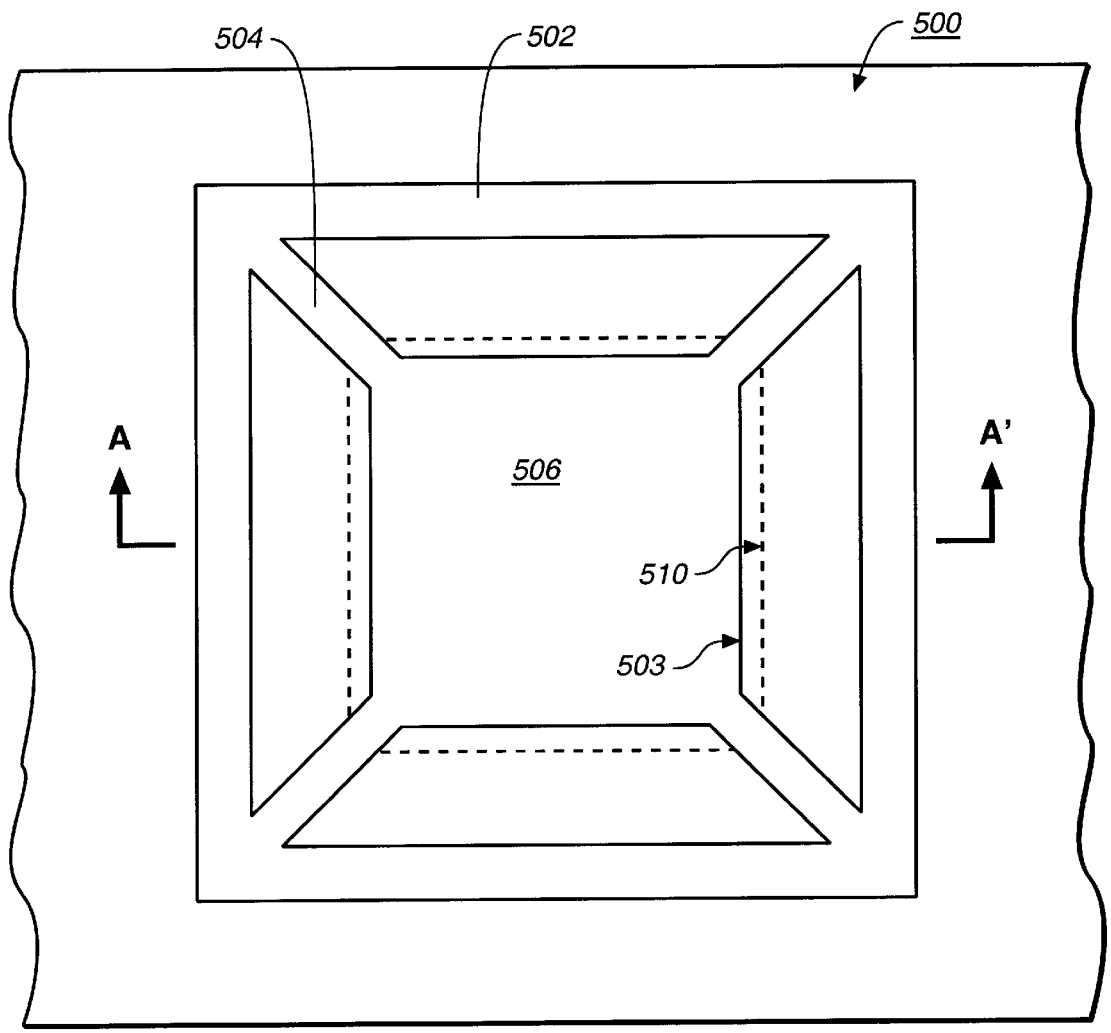
FIG._5

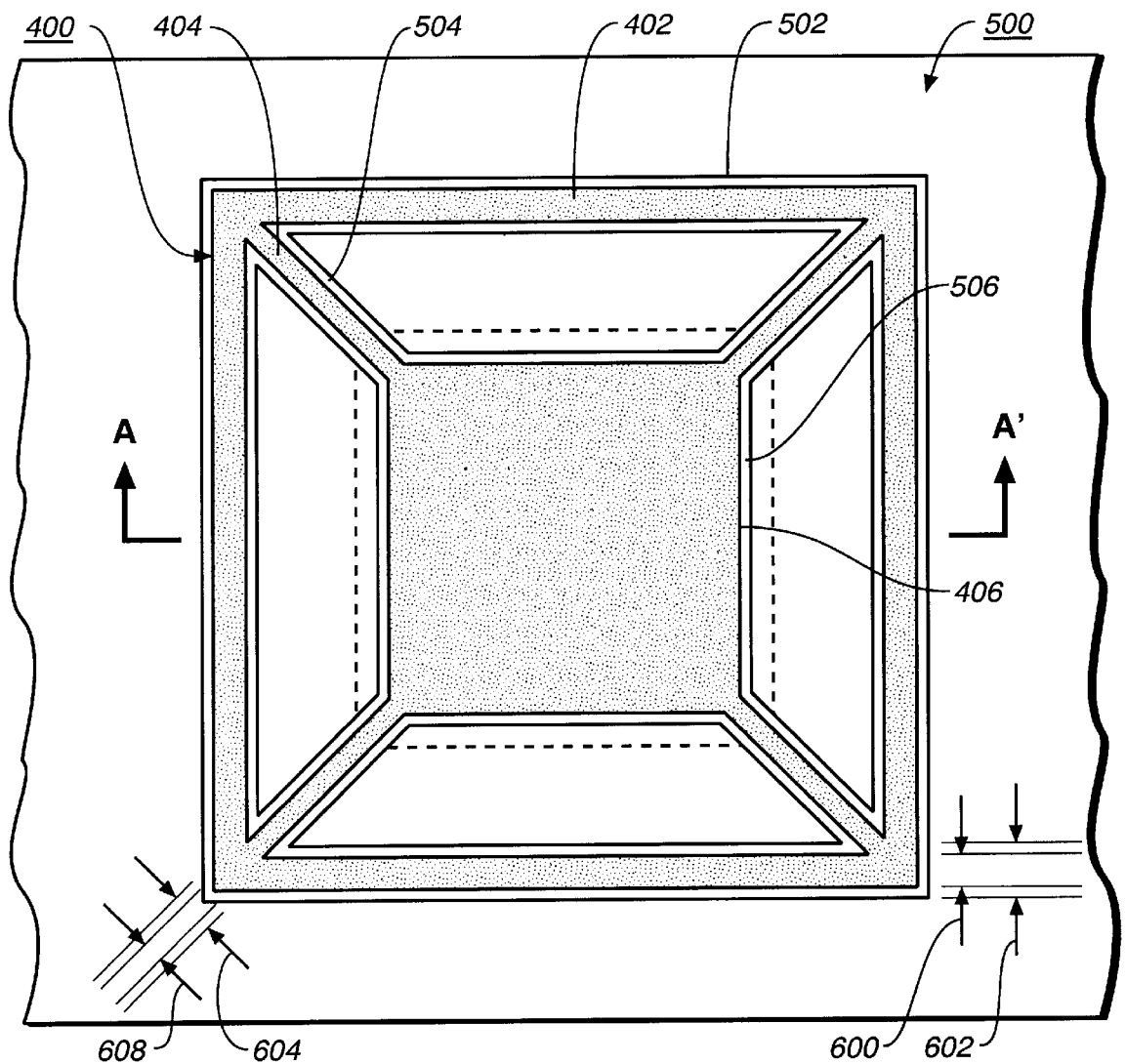
FIG._6

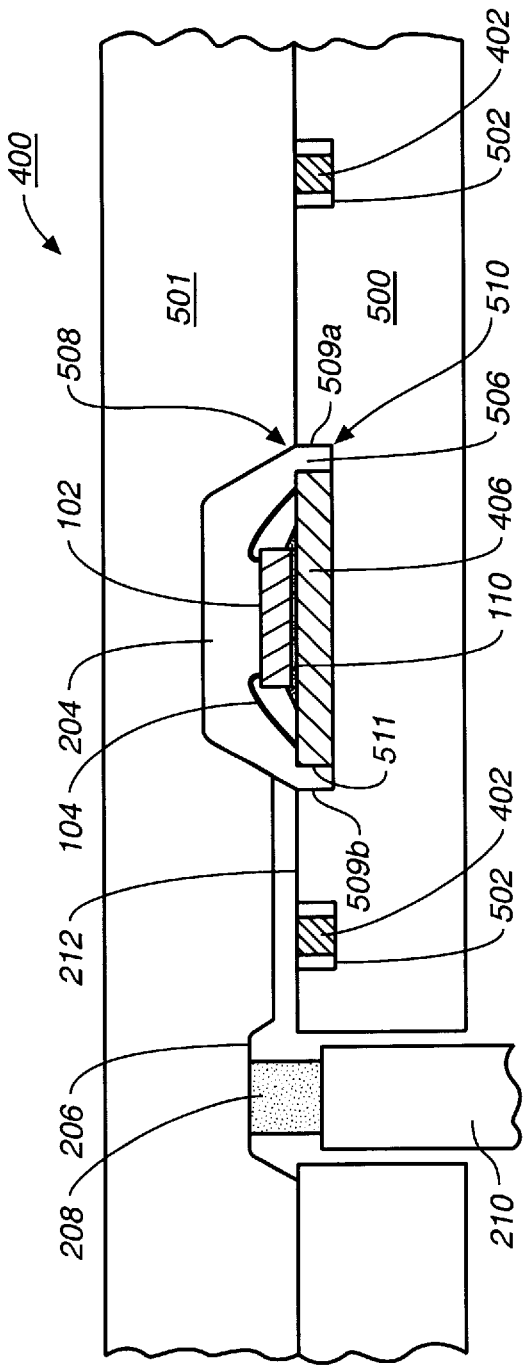
FIG._7
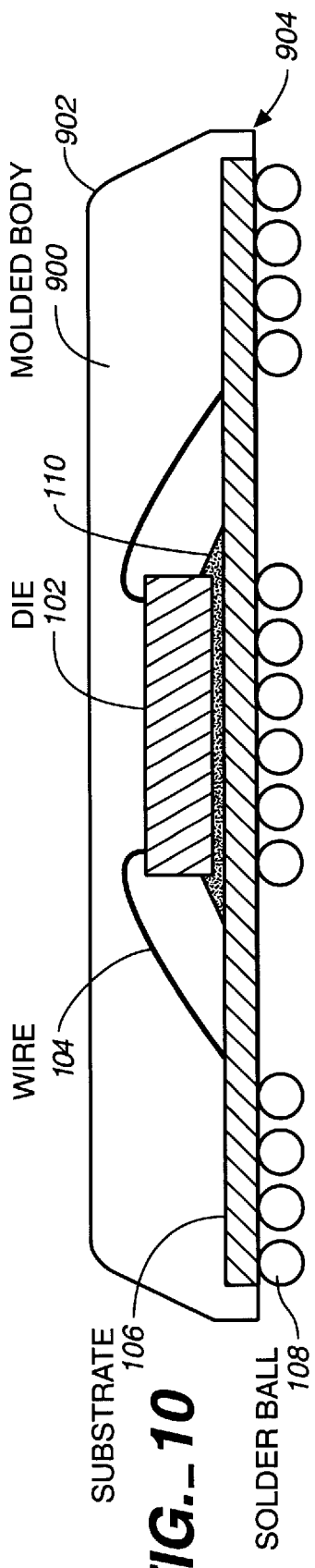
FIG._10

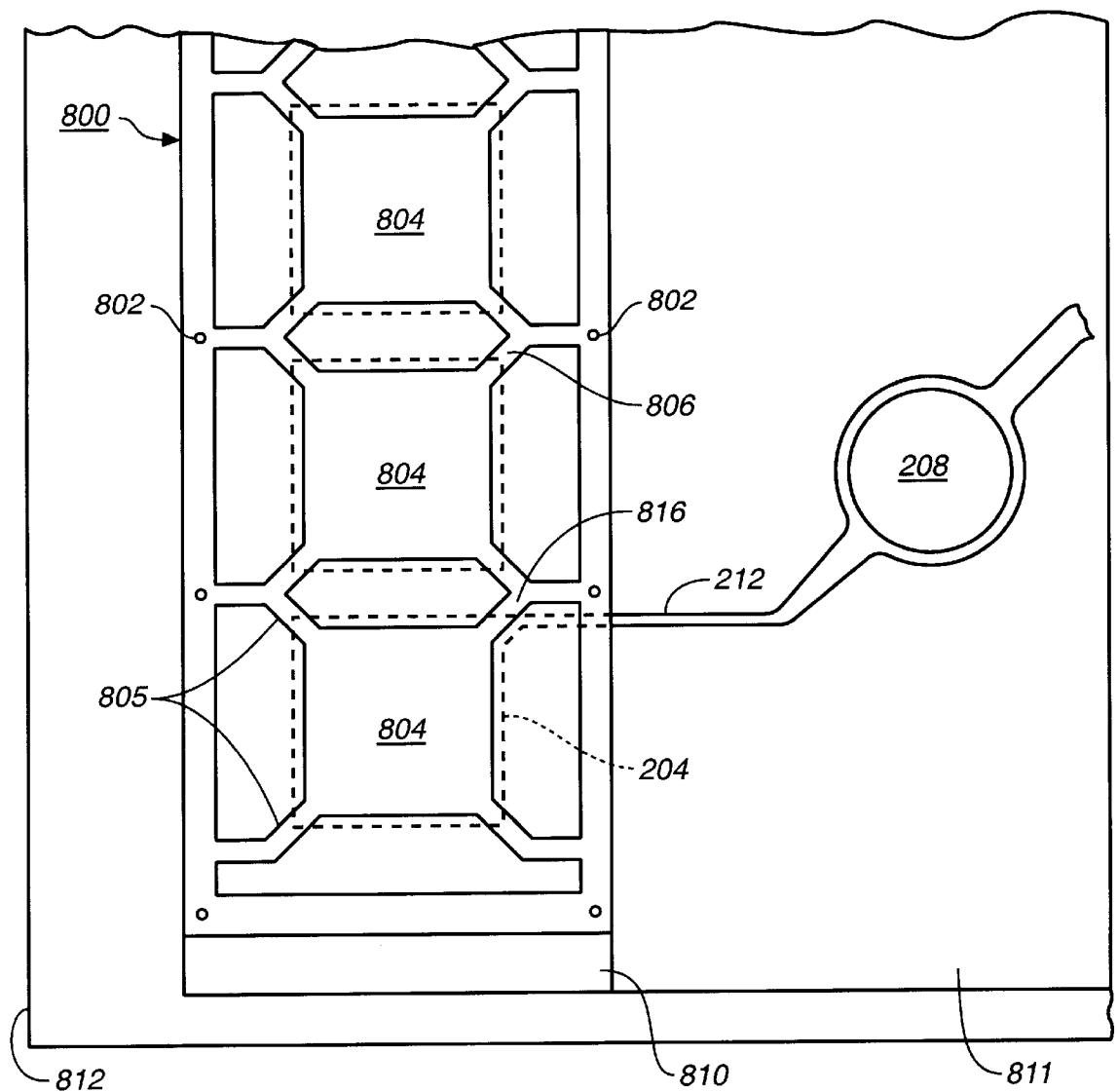
FIG._8

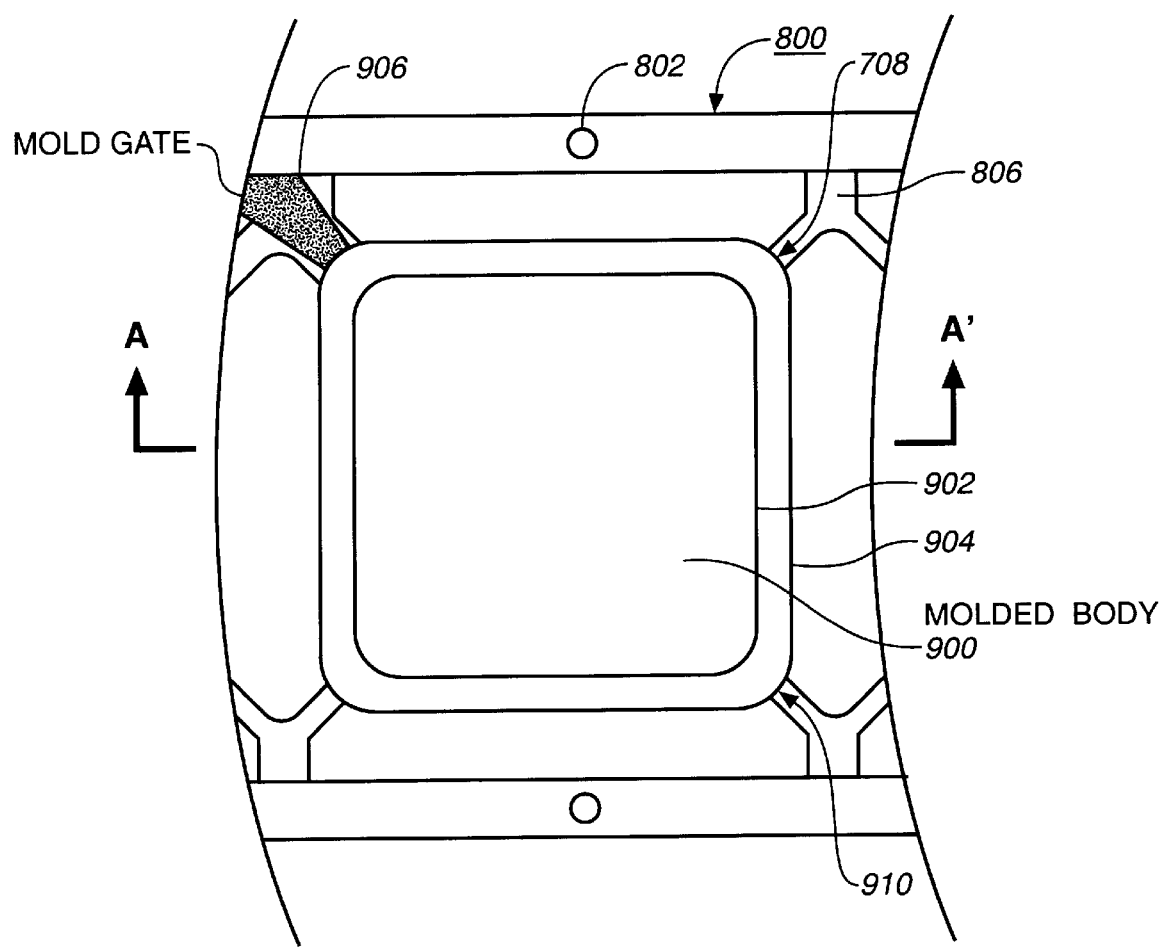
FIG._9

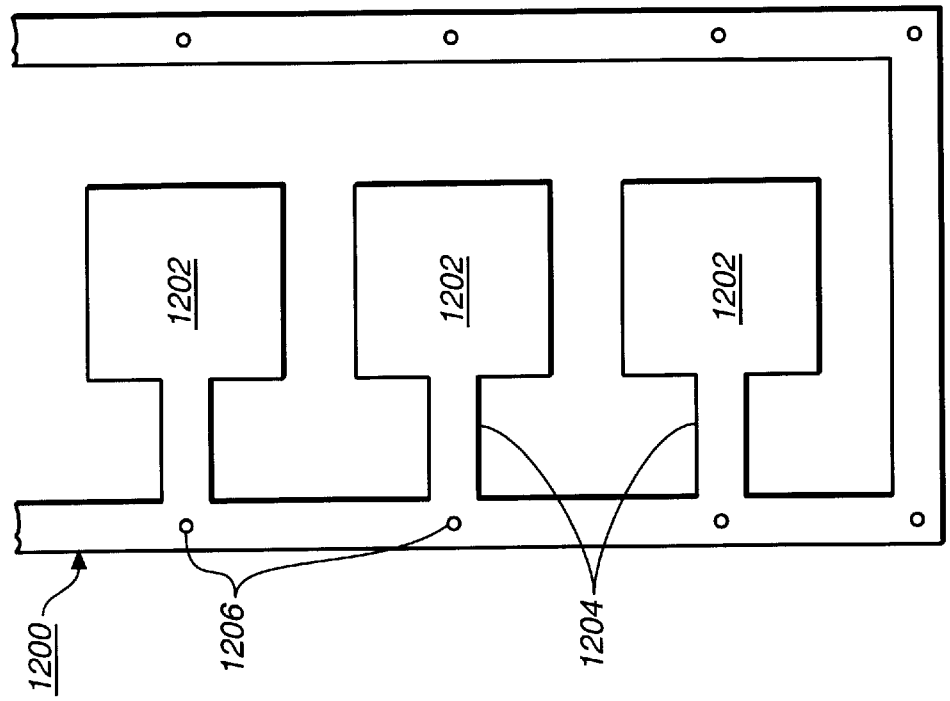
FIG._12
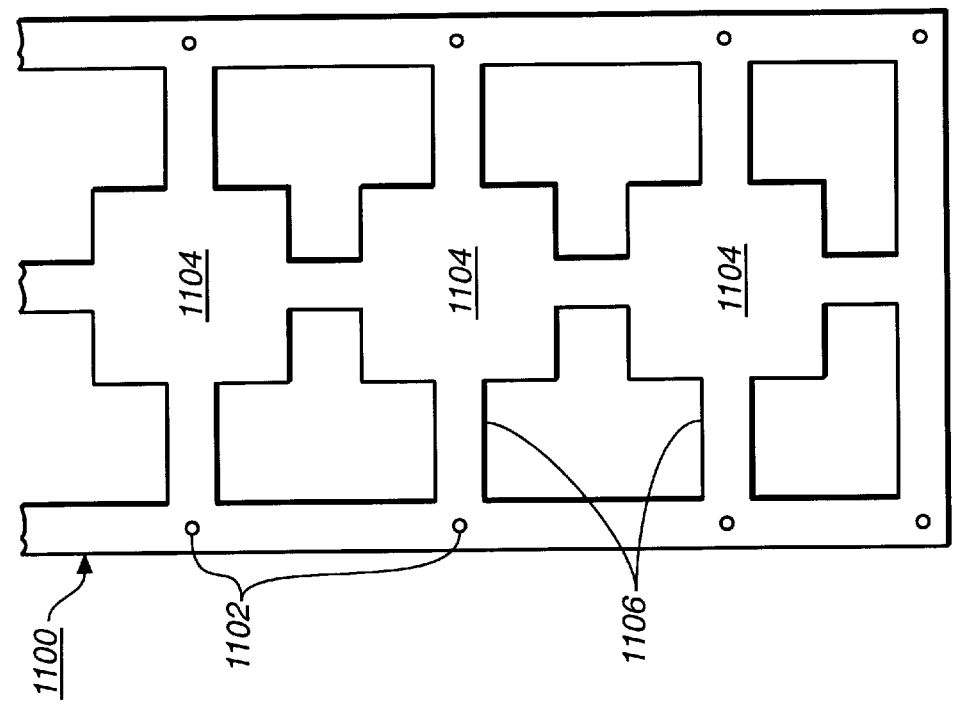
FIG._11

MOLDED ARRAY INTEGRATED CIRCUIT PACKAGE

TECHNICAL FIELD

This invention relates generally to the field of semiconductor packaging, and more particularly, to semiconductor packages formed on laminated package substrates, such as ball grid arrays. Still more particularly, the invention relates to improvements in transfer molding plastic encapsulations on laminated semiconductor packages.

BACKGROUND OF THE INVENTION

All Semiconductor packages must provide for a number of electrical connections to be made from bond pads on a semiconductor die to external contacts on the package while, at the same time, provide physical protection to prevent damage to the die during handling. As the ability to fabricate greater numbers of transistors on a given die size increases, the circuits on the die become more complex and require a greater number of external electrical connections. To accommodate the required number of external contacts, semiconductor packages have evolved from lead frame based packages, such as dual-in-line ("DIPs") and quad-flat-pack ("QFP") packages, to laminated substrate based packages, such as ball grid arrays ("BGA"). Additionally, different methods of providing electrical connections from the die to the package have evolved, such Is wire bonding and C4, or "flip-chip" techniques.

FIG. 1 is a cross-sectional view of a conventional BGA package. As shown, the package comprises a laminated substrate 106 formed of, for example, a ceramic or plastic material such as epoxy-glass. Electrically conductive traces (not shown) are formed on conductive layers of the substrate 106. Methods for forming conductive traces are known in the art. For example, photo-lithographic techniques may be used to image a desired pattern into a photo-resist material disposed on a conductive layer of the substrate 106. The photoresist material is then "developed," i.e., the photoresist material not exposed by the image, is removed, thereby creating a corresponding pattern of exposed conductive material on the substrate. The exposed conductive material is then removed in an etching process. Finally, the remaining photoresist material is removed, leaving the desired pattern of conductive material on the substrate.

Electrical connections between the layers is formed by conductive vias, such as via 114. Vias are formed in the substrate by known techniques, such as mechanical or laser drilling. After the via is created, it is plated with a conductive material to provide the desired electrical contact. A plurality of electrical contacts to the conductive traces of the package are provided on the lower surface of the package substrate 106. Solder balls 108 are attached to each of the contacts to allow electrical connection between the semiconductor package and external electronic components, such as printed wire boards. Solder balls 108 are conventional and typically are constructed from a lead-tin alloy and are attached to the contacts by well known methods such as re-flow soldering. Of course, other conventional electrical connectors could be substituted for the solder balls 108, such as conductive pins attached to contacts on the lower surface of substrate 106.

A semiconductor die 102 is mounted to the upper surface of the package substrate 106 by a suitable die attach material 10, such as epoxy. Electrical connection between bond pads on the die 102 and the conductive traces on the substrate 106 is provided by bond wires 104. Of course, as discussed previously, flip-chip techniques could also be used as a matter of design choice.

To protect the die 102 and bond wires 104, a molded covering 112 is formed on the substrate 106. Generally, molded covering 112 is formed on the package by a transfer or injection molding process. Conventional transfer molding processes are known to those of skill in the art and are described in, for example, U.S. Pat. No. 5,635,671, issued to Freyman et al., incorporated herein by reference. This is explained in greater detail with respect to FIG. 2.

FIG. 2 is a cross-sectional view of a conventional two-piece mold. In this case, the mold comprises an upper mold section 200 which is adapted to mate with a lower mold section 202. The lower mold 202 has a recess formed therein for receiving and holding the semiconductor package during the molding process. The semiconductor package is conventional and includes a package substrate 106 having a semiconductor die 102 mounted thereon by means of a die attach material 110. Electrical connection between the die 102 and the substrate 106 is provided by bond wires 104. Lower mold section 202 also has an opening formed therein for receiving a transfer ram 210. The transfer ram 210 is slideably inserted into an opening in lower mold section 202 to force molding material into the cavity 204 as will be discussed in greater detail herein.

A cavity 204 is formed in the upper mold section 200 such that when the mold sections are placed together the cavity 204 is disposed over the die 102 and bond wires 104. As seen from the figure, the shape of the cavity 204 controls the shape of the molded covering. It will also be noted that the sides of the cavity 204 are provided with a slight slope to make removal of the package from the mold easier. Upper mold section 200 is also provided with a cavity 206 which is designed to receive the molding material 208. Cavity 206 is sometimes referred to as the "pot." Molding material 208 is generally a plastic material, such as "SMT-B1", commercially available from Plaskon Corp. A channel 212 is formed in upper mold section 200 which connects the pot 206 to the cavity 204. The channel 212 is sometimes referred to as the "runner" channel.

It will be understood by those of skill in the art that the mold sections are generally designed to fit within a frame, referred to as a "chase", during the molding process. The mold sections are often formed as separate removable units, referred to as "bars". The bar which corresponds to the upper mold section will be referred to herein as the "cavity bar". Each cavity bar has a multiplicity of mold cavities, such as cavity 204, formed thereon to allow molding of several packages at once. The mold bars are typically removable from the chase so that the same chase can be used to mold different size packages simply by substituting different mold bars. Similarly, a multiplicity of pots are also often formed on a separate bar, referred to as a "runner bar", to allow substitution of different pots for different packaging applications. To allow the simultaneous molding of a number of packages, the substrates are provided on a substrate strip which contains multiple substrates which are later singulated after the molding process. This is described in greater detail with respect to FIGS. 3A–3B.

FIG. 3A is a top view of a substrate strip 300. Substrate strip 300 contains four substrates, 302 (for simplicity, only two substrates are denoted by the number 302). Substrate strip 300 is also provided with a number of tooling holes, such as tooling hole 304, around its outer perimeter to allow the substrate strip 300 to be attached to other devices in the molding process, such as the cavity bars. Slots 306 are formed on substrate strip 300 between each of the substrates 302. Slots 306 operate to provide stress relief to the strip 300 to reduce or prevent warping during the molding process.

Punching holes 305 are also provided on strip 300 at the corner of the substrates 302. Punching holes 305 are useful during the singulation process to reduce or prevent rough edges from being created on the substrates when they are punched out of the strip. Each substrate 302 is provided with a die attach area 307 to allow attachment of a semiconductor die (not shown) to the substrate 302. The die is attached both mechanically, by for example, die attach material, and electrically, by for example, bond wires or flip-chip solder ball connections.

It will be understood that substrates 302 are substantially the same as substrate 106 shown in FIG. 1 in that they are formed from a laminate material and are provided with conductive traces and vias, as discussed previously. The opposite side of strip 300 (not shown) is provided with conductive regions intended to provide electrical connection between conductive traces on the substrate and corresponding electrical contacts on external circuitry, such as printed wire boards ("PWB"). Such electrical connections are often referred to as second level interconnects and are implemented by, for example, solder balls as shown in FIG. 1.

FIG. 3B is a top view of conventional molding equipment with substrate strips attached. As shown, the molding equipment includes a mold chase 308. The mold chase allows attachments of cavity bars 310 on each side which are separated by runner bar 312. Substrate strips 300 are attached to cavity bars 310 by tooling holes 304 which fit over corresponding pins projecting from the top surface of the cavity bars 310. Slots 306 are, again, provided between the substrates 302 to help prevent warping of the strip 300.

Each substrate 302 is aligned with a cavity 204 (indicated by dotted lines) formed on the cavity bar 310. The strips 300 are disposed on the cavity bars 310 such that the upper, or die attach surface, faces the top surface of the cavity bar 310. Thus, the (lie and bond wires mounted to each of the substrates will be enclosed by the cavity 204. For simplicity, only one cavity is denoted by the numeral 204. It is to be understood, however, that the other cavities illustrated in the figure are substantially similar, and the following description is equally applicable to them.

Cavity 204 is connected by runner channel 212 to pot 206. Pot 206 is one of four substantially similar pots formed on runner bar 312. Each pot feeds two cavities on either side of the runner bar 312. However, this is for purposes of illustration, and numerous other arrangements are known in the art. Runner channel 212 joins cavity 204 at gate 316. Gate 316 is generally smaller in cross-sectional area than channel 212 to assist in the degating process (i.e., removal of the molded package from the runner) after the molding is complete.

Since the molding operation is substantially the same for each of the substrate strips 300, it will be described with respect to a single package substrate 204 and its associated molding material pot 206, for the sake of simplicity. After the substrate strips 300 are attached to the cavity bars, the molding material is placed into the pot 206, and the bar containing the lower mold sections are pressed against the cavity and runner bars shown in the figure. This holds the substrate strips 300 firmly in place. Transfer rams (not shown) are then pushed into the pot 206 in order to force the mold material through runner channel 212 and gate 316 and into cavity 204. A sufficient amount of material is forced into cavity 204 to completely fill the cavity and enclose the die and bond wires (not shown) on the package substrate 302. After the mold material cures, the bars are separated and the substrate strips 300 removed. The package substrate 302 is then singulated, for example, by punching, out of the strip 300, resulting in a molded semiconductor die, such as that shown in the cross-section view of FIG. 1.

However, the semiconductor package as shown in FIG. 1 suffers from several drawbacks. For example, moisture is often able to penetrate the semiconductor package at the junction between the molded body 112 and the upper surface of substrate 106. Such moisture penetration is undesirable and may eventually result in damage to the die 102 and/or bond wires 104. If the damage is sufficient, then, of course, the entire package will cease to function properly. Moreover, since the substrate 106 itself is also formed of a laminated material, as discussed previously, it is also vulnerable to moisture penetration between the laminated layers. Again, such moisture penetration is undesirable and may damage or destroy the device.

Additionally, it is desirable to minimize the thickness of the substrate 106. Thinner substrates are not only cheaper to produce, but also allow smaller vias which, in turn, permit greater routing density of the conductive traces formed on the package. Moreover, thinner substrates are more reliable than their thicker counterparts. However, substrate 106 must also be thick enough to provide sufficient mechanical integrity to the substrate to allow handling of the semiconductor package during, for example, shipping and attachment to the printed wire board. If substrate 106 is made too thin, then the substrate will bend and warp, possibly damaging the electrical connections on the package. These considerations limit the amount of thickness reduction possible in conventional devices.

SUMMARY OF THE INVENTION

Accordingly, it is an object of the present invention to provide improved semiconductor packages which allow the use of substrates having reduced thickness without risk of damage due to a lack of mechanical strength. Moreover, it is also an object of the invention to provide semiconductor packages with improved moisture resistance, particularly at the junction of the molded body and the substrate, as well as the substrate edges. Still further objects and advantages of the present invention will become apparent in view of the following disclosure.

The present invention achieves these and other objects by providing a substrate frame to which one or more individual package substrates are connected. Each individual package substrate is typically designed to hold one semiconductor die. In one version of the invention, the substrate frame is square or rectangular, depending on the shape and number package substrates attached. Each of the attached package substrates is attached to the substrate frame by one or more short sections of the substrate material, referred to as substrate straps. Thus, the substrate straps are typically integrally formed with the package substrate and the substrate frame. For example, with respect to laminated plastic substrates, the substrate frame, substrate straps and package substrate are all formed from the same, contiguous laminated plastic sections. In one particular version of the invention, the substrate straps are formed as extensions from each corner of a rectangular package substrate. Thus, the package substrate is attached to the frame at four points.

Conductive traces, vias, solder resist areas, etc., are formed on the individual package substrates according to conventional methods, such as described earlier. After the substrate frame and the attached package substrates are created, the semiconductor dies are attached to the package substrate according to well known methods, such as wirebonding.

Once the package substrates and frames have been assembled as described above, the package substrates are ready to be covered with a plastic molding material in order to provide the protective covering. According to an aspect of the invention, this is performed in a molding process. However, unlike conventional molding processes, the invention allows the molding material to cover the edges of the package substrates. This serves to seal off the laminated boundaries from contact with moisture or other chemical materials which may penetrate between the laminations in the package substrate and cause damage or destruction to the device. Additionally, the hardened molding material provides additional structural support for the package substrates, thus permitting the use of thinner package substrates than in conventional devices.

According to one aspect of the invention, the frame and substrate straps operate to hold the package substrate within a specially created recess in a first, or lower, mold section to allow the molding material to surround the package substrate edges. More specifically, the recess is created such that a gap exists between the walls of the recess and the side edges of the package substrate. The package substrate is held in the center of the recess, and not allowed to move against any of the recess walls, by the substrate straps which are connected to the frame. Molding material is then transferred into the gap as will be described in greater detail herein. Similar recesses, or channels, are also created in the mold section to accommodate the substrate straps and the substrate frame.

An upper mold section is then coupled to the lower mold section. The upper mold section has a cavity formed therein which completely covers the package substrate and mates with the recess in the lower mold. In this way, a cavity is created completely around the package substrate, including its edges, except for the lower surface of the package substrate, which rests against the bottom of the recess, and the small portion of the package substrates which are joined to the substrate straps that protrude out of the cavity.

A runner channel is typically provided in one of the molds to permit transfer of a fluid molding material into the cavity and around the package substrate. This transfer of molding material is performed according to well known techniques, such as injection molding or transfer molding. For example, a transfer ram is used to force the molding material out of a material cavity and through the runner channel.

A sufficient amount of molding material is used to completely fill the cavity around the package substrate. The material is then cured, or solidified, according to well known techniques, and the package substrates are removed from the mold. Afterwards, the finished package substrates having a molded covering as described above, are detached from the substrate frame. This detachment is often referred to as singulation and is performed according to known techniques such as punching or sawing. Of course, it will be recognized that singulation only requires severing the substrate straps.

Of course, numerous variations of the invention are possible which provide other improvements and advantages over conventional devices. Some of these variations and the advantages thereof will become more apparent in view of the following detailed disclosure of particular embodiments.

BRIEF DESCRIPTION OF THE DRAWINGS

FIG. 1 is a cross-sectional view of a conventional ball grid array semiconductor package.

FIG. 2 is a cross-sectional view of a molding apparatus for providing the molded body on top of the conventional BGA package shown in FIG. 1.

FIG. 3A is a top view of a conventional substrate strip.

FIG. 3B is a top view of a chase having a pair of cavity bars and a runner bar fitted therein.

FIG. 4 is a top view of a substrate according to an embodiment of the invention.

FIG. 5 is a top view of a recess and a lower mold session according to an embodiment of the invention.

FIG. 6 is a top view of the recess shown in FIG. 5 having a substrate according to an embodiment of the invention placed therein.

FIG. 7 is a cross-sectional view of a molding apparatus for providing a molded body covering on a semiconductor package according to an embodiment of the invention.

FIG. 8 is a top view of a mold chase having a cavity bar and a substrate strip fitted thereon according to an embodiment of the invention.

FIG. 9 is a top view of a molded body on a substrate according to an embodiment of the invention after the upper mold has been removed.

FIG. 10 is a cross-sectional view of a semiconductor package according to an embodiment of the invention.

FIG. 11 is a top view of a substrate strip according to still a further embodiment of the invention.

FIG. 12 is a top view of another substrate strip according to still a further embodiment of the invention.

Detailed Description of Embodiments of the Invention

Referring now to FIG. 4 there is shown a top view of a substrate 400 according to an embodiment of the invention. The substrate 400 is constructed from a laminar material such as an epoxy-glass. In one exemplary embodiment, the substrate 400 is manufactured from CCL-HL832 BT Laminate, commercially available from Mitsubishi Gas and Chemical Corp.

The substrate 400 comprises a package substrate 406. Package substrate 406 is similar to conventional package substrates in that it contains conductive traces and vias for establishing electrical connection between a die (not shown) and external electronic components, such as printed wire boards. Accordingly, package substrate 406 includes die attach area 408. Die attach area 408 provides a location for the attachment of the semiconductor die. As discussed previously, the die is attached mechanically, for example, by a die attached material, and electrically, for example, by wire bonding the die to contacts formed on conductive traces 410. Outside of the die attach area 408, the substrate 400 is typically covered with a solder resist material, such as PSR 4000, commercially available from Taryo Ink Corp. The opposite side of package substrate 406 (not shown) is provided with a plurality of electrical contacts for providing electrical connection to external electronic components. This electrical connection may be performed through conventional techniques, such as solder balls attached to the electrical contacts on the opposite side of packaged substrate 406.

Each corner of packaged substrate 406 is provided with a substrate strap 404 which is, in turn, connected to the substrate frame 402. Preferably, the substrate frame 402, straps 404 and packaged substrate 406 are all formed from a single piece of laminated substrate material. However, as will be described in greater detail herein, since the straps 404 and frame 402 will be removed from the finished semiconductor package, it is not necessary to provide conductive traces on these elements. Straps 404 and frame 402 are used to support the package substrate 406 within a mold so that the molding material can completely cover the side edges of the packaged substrate 406.

FIG. 5 is a top view of a lower mold section 500 according to an embodiment of the invention for use with a substrate such as shown in FIG. 4. The mold section 500 is preferably formed as "a bar" useful in a transfer molding process, such as described previously. For simplicity, only one recess for holding the substrate on the lower mold section 500 is illustrated. Of course, it will be appreciated that any number of recesses could be provided to the bar as a matter of design choice.

More particularly, the lower mold section 500 has a first recess 502 formed therein. Recess 502 is formed as a channel which corresponds to the substrate frame 402 of the substrate 400. Similarly, a plurality of strap receiving channels 504 are connected to frame channel 502 and joined with package substrate recess 506. Strap receiving channels 504 are dimensioned to receive straps 404 on the package substrate 400. Recess 506 is formed to receive the package substrate 406. It will be noted that the sidewalls of recess 506 are, in this embodiment, not perpendicular with the surface of mold 500, but rather slope inward from the upper surface of the mold 500. Thus, the perimeter of the recess is greater at the top of the recess walls 510 than at the bottom of the recess walls 508. This improves the ease with which the substrate can be removed from the mold.

FIG. 6 is a top view of a mold 500 with a substrate 404 placed therein. It is to be noted that in this embodiment, all recesses formed in the mold 500 have substantially the same depth as the thickness of the substrate 400. Thus, when the substrate 400 is placed in the mold 500 the upper surface of substrate 400 is flush with the upper surfaces of mold 500. It is also to be understood that the substrate 400 is placed in mold 500 such that the die attach area faces upward, or away, from the mold 500 and the lower surface of the package substrate 406 rests on the bottom of the recess.

In operation, an upper cavity section is placed on top of the lower mold 500 to form a cavity over the packaged substrate 406. The molding material is then injected into this cavity in order to cover the semiconductor die and bond wires of the die mounted on the die attach area. It is desirable to minimize the amount of molding material which flows into the strap channel 504 on the lower mold 500. This is because it is difficult to punch through plastic molding material during the singulation process. Since the molding material is fairly viscous, it is possible to minimize the amount of material which flows into the strap channel 504 by constructing the width of channel 504 such that it is only slightly greater than the width of the substrate strap 404. More specifically, dimension 604 illustrates the width of the strap channel 504, while dimension 608 illustrates the width of the strap 404. In one particular embodiment, the width of channel 604 is approximately 0.040 inches. At the same time, the width of the strap 404 is 0.030 inches. This allows for manufacturing tolerances in the substrate and mold. The 0.005 inches of mold material on the sides of the strap can be easily cut at singulation.

Similarly, it is also desirable to maintain tight dimensions between the substrate frame 402 and the frame channel 502. In one particular embodiment, the frame channel 502 is between about 0.200 inches and about 0.210 inches in width, while the substrate frame 602 is between 0.180 and about 0.190 inches in width. This minimizes the amount of backflow of mold material into this channel.

Referring to FIG. 7, there is shown a cross-sectional view of the mold 500 similar to that depicted in FIG. 6 taken along section A–A'. As shown, the substrate 400 is placed in the lower mold section 500. An upper mold section 501 is disposed on lower mold section 500 to form a cavity 204 over the package substrate 406 and the attached semiconductor die 102 and bond wires 104. As is conventional, semiconductor die 102 is attached by a die attach material 110. The substrate frame 402 is shown disposed in frame channel 502 in the lower mold section 500. It will be understood that, although not seen in the cross-sectional view along section A–A', the package substrate 406 is, nevertheless, attached to the substrate frame 402 by substrate straps 404. Accordingly, package substrate 406 is prevented from moving within the cavity 204 during the molding process.

The perimeter size of the package substrate 406 is smaller than the perimeter size of the recess. If the recess walls are sloped, then the perimeter size of the package substrate 406 is smaller than the recess perimeter at the base of the recess. This difference in perimeter size between the substrate and the recess creates a clearance between side edges 511 of the package substrate 406 and the walls 509a and 509b of the package substrate recess 506. This allows the molding compound to not only fill cavity 204 to cover the upper surface of the packaged substrate 406, but to also cover the side edges as well by flowing into the clearance. Once cured, the molding material provides increased mechanical integrity to the packaged substrate 406 and seals off the edges of the packaged substrate 406 from moisture. The thickness of the molding material at the edges of the package substrate 406 is, obviously, related to the clearance, or gap, between the side edges of the package substrate 406 and the walls of the recess 506.

It is also to be noted that the side walls 509a and 509b of recess 506 are depicted to further illustrate different embodiments of the invention. In one embodiment, side wall 509b is substantially perpendicular to the bottom of recess 506. This creates a molded package having a substantially flat edge, or belt, around its base area. Additionally, the distance between the edge 511 of the package substrate and the side wall 509b controls the thickness of the molding material around the package substrate and ensures that this thickness is uniform from the bottom to the top surface of the substrate. In one particular embodiment, the edge 511 of the package substrate 406 is spaced at least 0.020 inches from the side wall 509b of the recess 506. A separation lower than this will be difficult to fill. A larger dimension will increase the size of the package which is generally not desirable.

In an alternative embodiment, side wall 509a of the recess 506 is not perpendicular with the upper surface of the mold 500, but rather slanted outward from the base of the recess 506. Thus, the bottom edge 510 of the wall of recess 506 is closer to the package substrate 406 than the upper edge 508 of the wall. The slope provided to side wall 509a aides in the removal of the package substrate 406 from recess 506 after the molding is complete. In one particular embodiment, the slope is between about 10° and about 15° from the perpendicular. A smaller slope angle is desirable for mechanical strength. However, a slope below 7° may make it difficult to remove package from mold.

In operation, the molding apparatus shown in FIG. 7 functions in a similar fashion to conventional transfer molding equipment. More specifically, a transfer ram 210 is pushed upward into material cavity, or pot, 206. This compresses the mold material 208 and forces it to flow through runner channel 212 into the cavity 204 and the gap between the side edges of package substrate 406 and the walls of recess 506. After the transfer of molding material is complete, the molding material is hardened, or cured. Curing is performed according to known techniques which are dependent on the particular molding material used. For example, a cure time of 4 hours is desirable for Plaskon SMT-1B mold compound at a temperature of 175° C. After curing, the mold sections are separated and the substrate is removed. The substrate straps 404 are then severed in order to detach the package substrate 406 from the frame 402. The resulting packaged semiconductor device is shown in cross-section in FIG. 10.

As shown in FIG. 10, a semiconductor device according to an embodiment of the invention includes a semiconductor die 102 which is electrically connected by bond wires 104 to conductive traces (not shown) on the package substrate 406. Die 102 is also mechanically attached to substrate 406 by die attach material 110. Electrical connection to external electronic components is provided by solder balls 108 attached to the lower surface of the package substrate 406 in a separate process after the molded body 900 has been formed on the substrate 406 as described above. It is seen that molded body 900 completely covers the upper surface of substrate 406 and has a flat upper area with sloping sides 902. A belt 904 of molded material is formed around the side edges of substrate 406. The thickness of the belt 904 is, of course, substantially equivalent to the dimensions of the gap between the recess walls and the package substrate that existed when the package was molded.

Since the molded body 900 is formed of a hardened plastic material having a substantial thickness, for example for between about 0.040 inches and about 0.080 inches, it provides good structural integrity and resistance to bending during handling or shipping of the devices. Moreover, since the molded body 900 covers the substrate 406 according to this embodiment of the invention, it provides greatly increased structural rigidity to the substrate 406 and thus allows the use of the thinner substrates than in conventional devices.

More specifically, in conventional packages, such as that shown in FIG. 1, the portion of the laminated substrate 106 which is not covered by the molded body must have sufficient mechanical strength to resist bending or breaking when the package is handled during, for example, shipping or mounting to a PWB. Otherwise damage could result to the conductive traces or contacts on the substrate. However, in the embodiment shown in FIG. 10, the molded body 900 itself provides mechanical strength to the entire substrate 406, thus the mechanical strength of the substrate is much less critical. This allows the substrate to be made thinner than is practical in conventional molded packages. By reducing the thickness of the substrate, it is possible to make smaller conductive vias and, thus, increase the routing density of the conductive traces. For example, in one particular embodiment, the package substrate is between about 0.005 and about 0.010 inches thick, as compared to the 0.015 to 0.05 inches of thickness required to provide mechanical strength in conventional packages. Small vias allow more routing traces between vias. For example, a pair of vias of 0.030 inch diameter separated by 0.127 inch, allows two traces to be routed between them, whereas a pair of vias of 0.020 inches in diameter will allow three traces to be routed between them.

In other embodiments of the invention, it is desirable to provide a method in which several packages are molded simultaneously. This greatly improves production, efficiency, and lowers the cost of the finished devices. Therefore, with reference now to FIG. 8, another version of the invention is depicted in which a number of package substrates 804 are provided on a substrate strip 800. The substrate strip 800 acts as the substrate frame discussed previously. The substrate strip 800 is provided with a number of tooling holes, such as tooling hole 802, which allow the substrate strip 800 to be attached to other molding equipment, such as cavity bars. Each of package substrates 804 is provided with a substrate strap 806 extending from each corner. In geometry depicted, a pair of substrate straps 806 from adjoining package substrates 804 are joined to form a "Y" shape which is attached to the substrate strip 800 as shown. However, this is only for purposes of illustration, and other geometries are possible as will be described in greater detail herein.

A lower mold section similar to that shown in FIG. 5 is created as a molding bar designed to fit within a chase 812. Of course, the bar will have one recess for each of the package substrates 804 on the substrate strip 800, and the frame and strap channels for the recess are similarly modified to match the geometry of the substrate strip 800 as shown in the figure. Similarly, an upper mold section is formed as a cavity bar which has the molded body cavity and runner channel formed therein in a manner similar to that described with respect to FIG. 7.

As shown in FIG. 8, the substrate 800 is placed on top of a cavity bar 810 which is held within a chase 812. A runner bar 811 is placed within the chase 812 adjacent to the cavity bar 810. Runner bar 811 typically has a number of pots 208 formed therein to allow transfer of the molding material. In the figure, only one pot 208 is shown for the sake of simplicity. Pot 208 is connected by runner channel 212 to gate 316 on a cavity bar 810. Gate 316 is, in turn, connected to the molded body cavity 204. Molded body cavity 204, and a portion of runner channel 212 and gate 316, all are indicated by dashed lines to illustrate their location and shape "underneath" the substrate strip 800. Only one molded body cavity 204 and gate 316 are depicted in the figure for the sake of simplicity. It is to be understood that similar structures would be provided for each of the package substrates 804 in an actual production device. In one particular embodiment, the size and shape of the gate 316 is preferably 0.050 inches wide by 0.015 inches high, and sloped to the top to allow removal and release from the mold cavity.

After the molding material is transferred from the pot to the cavity, it is cured before the substrate strip is removed. FIG. 9 is a top view of a portion of a substrate strip 800 after the substrate strip is removed from the mold. Only single package substrate is shown. As discussed previously, the substrate strip 800 has tooling holes 802 formed thereon and the package substrate is connected to the edges of the substrate strip 800 by substrate straps 806 extending from each corner of the package substrate. The molded body 900 which covers the package substrate and the semiconductor die has an upper, flat surface with sloping sides 902 which extend to the belt 904. At that point, the sides of the molded body 900 extend down perpendicular to the upper surface of the substrate strip to the lower surface of the substrate. Alternately, the sides of the molded body 900 may be provided with an inward slope in order to assist in the removal of the substrate strip 800 from the mold, as discussed with respect to 7. The molded body 900 completely covers the edges of the package substrate with the exception of where the substrate straps 806 protrude from the molded body 900 at the corners of the package.

When the substrate strip 800 is removed from the mold, excess cured molding material extending from the mold gate 906 to a "runner," i.e., the cured mold material which was trapped in the runner channel during molding, is still attached to the substrate strip 800. This material is removed from the substrate strip 800 in a process referred to as "degating." The substrate strip 800 may be degated by conventional means. For example, by bending the substrate strip away from the runner strip. The gate size is made substantially smaller than the runner so that the break point is at the gate.

After the degating process is complete, the individuals package substrates are separated from the substrate strip. This separation process is referred to as singulation. Conventional singulation processes involve punching, sawing or snapping the package substrates out of the substrate strip. Punching typically uses a die set in a mechanical press. Suitable punching equipment is known in the art and commercially available from a variety of manufacturers including Kras Equipment, TOWA, and Yamada Corporations. In the embodiment shown in FIG. 8, it is seen that singulation is performed by simply punching through each of the four substrate straps 806 at the corners 908 of the package substrate. This is less stressful to the package substrate than punching four complete package edges, as in conventional packages. Also, since the edges of the finished package are part of the molded body, they are consistently smooth and not subject to burrs or roughness due to a poor punch. In order to ensure smooth edges at the corners of the package, punching holes 910 (only one is depicted for simplicity) may be provided in the substrate straps. The straps may also be scored to assist in the detachment. After the singulation process is complete, the package is provided with electrical contacts, such as solder balls formed from a tin-lead alloy, in order to provide electrical connection between the semiconductor package and the printed wire board to which it is to be connected. The solder balls, and techniques for attaching them, are well known to those of skill in the art and will not be described further herein. Further, it within the abilities of those of skill in the art to modify the invention for other types of know electrical connections, such as conductive pins.

Referring now to FIG. 11, there is shown a top view of a substrate strip 1100 according to another embodiment of the invention. The substrate strip 1100 is formed of, for example, a laminated plastic material having a number of conductive traces formed thereon as discussed previously. In this case, the substrate strip 1100 again is provided with tooling holes 1102 and a number of individual package substrates 1104 which are connected to the strip 1100 by substrate straps 1106. The substrate straps 1106 are attached at the sides rather than the corners of the individual package substrates 1104. This version of the invention is useful during the singulation process because the substrate straps 1106 are only punched along one line, rather then two lines as required by the corner substrates straps discussed previously. This helps to reduce edge roughness after singulation. Modifications required to the molds to accommodate the side straps 1106 are within the ability of one skilled in the art in view of the teachings of the present disclosure. This embodiment also provides four attachment points for each package substrate 1104.

In still another embodiments, the number of substrate straps may be reduced to make singulation even easier, although the strips may be somewhat more difficult to handle. For example, as shown in FIG. 12, each package substrate 1202 is attached to the substrate strip 1200 by a single substrate strap 1204. In this case only one strap must be severed. Additionally, the finished package will be even more resistant to moisture because an even smaller area of the substrate will be exposed, i.e., the cross-sectional area of a single strap 1204. Still other variations of the invention are possible. For example, referring again to FIG. 12, it will be noted that the frame of the substrate strip 1200 is not connected to the right hand side of the package substrates 1202. Thus, this portion of the frame, as well as the connecting frame portion on the bottom, can be removed, leaving the package substrates 1202 attached to a single rail frame 1200.

Various embodiments of the invention have been described above. These embodiments are intended to be illustrative, and not limitative. Certain modifications in form and detail will be apparent to those skilled in the art without departing from the scope and spirit of the claims set forth below. All publications described herein are hereby incorporated by reference as though set forth in full.

What is claimed is:

1. A semiconductor substrate comprising:
   a package substrate having first and second surfaces with conductive traces formed thereon and structures for providing electrical connection between selected conductive traces;
   a die attach area on the first surface of the package substrate adapted to provide physical connection to a semiconductor die, the die attach area having conductive contacts for providing electrical connection between the die and conductive traces on the first surface;
   a package frame;
   at least one substrate strap which connects the package substrate to the package frame, the substrate strap being formed integrally with the package substrate and the package frame.

2. A semiconductor substrate as in claim 1 wherein the substrate strap extends from a corner of the package substrate.

3. A semiconductor substrate as in claim 1 which comprises a plurality of substrate straps, each substrate strap extending from a corner of the package substrate.

4. A semiconductor substrate as in claim 1 which comprises a plurality of substrate straps, each substrate strap extending from a side of the package substrate.

5. A semiconductor substrate as in claim 1 wherein the package substrate comprises a laminated material.

6. A semiconductor substrate strip having a strip frame and plurality of individual package substrates, the substrate strip comprising:
   at least one package substrate having first and second surfaces with conductive traces formed thereon and structures for providing electrical connection between selected conductive traces;
   a die attach area on the first surface of the at least one package substrate adapted to provide physical connection to a semiconductor die, the die attach area having conductive contacts for providing electrical connection between the die and conductive traces on the first surface;
   wherein the at least one package substrate is joined to the strip frame by at least one substrate strap, the substrate strap being formed integrally with the package substrate and the strip frame.

7. A semiconductor substrate strip as in claim 6 wherein the at least one package substrate is joined to the strip frame by a plurality of substrate straps, each substrate strap extending from a corner of the package substrate.

8. A semiconductor substrate strip as in claim 6 wherein the at least one package substrate is joined to the strip frame by a plurality of substrate straps, each substrate strap extending from a side of the package substrate.

9. A molding apparatus for forming a molded body on a semiconductor package, the semiconductor package including a package substrate having conducive traces, a semiconductor die mounted to an upper surface of the package substrate and a plurality of electrical connectors which provide electrical connection between the semiconductor die and the conductive traces, the package substrate being connected to a substrate frame, the molding apparatus comprising:

a first mold having mold body cavity formed therein for forming a molded body over the upper surface of the substrate;

a second mold having a recess for holding the package substrate, a frame channel for holding the substrate frame, the frame channel being formed outside the recess, and a substrate strap channel for holding a substrate strap, the substrate strap channel joining the recess and the frame channel;

a runner channel formed in one of the molds to provide a flow path to transfer a molding material from a material cavity to the mold body cavity.

10. A molding apparatus as in claim 9 wherein a clearance is provided between the walls of the recess and the edges of the package substrate to allow molding material to substantially cover the edges of the package substrate when the molding material is transferred into the mold body cavity.

11. A molding apparatus as in claim 9 wherein the walls of the recess are formed to slope away from the package substrate at the base of the recess.

12. A method for forming a molded body on a semiconductor package, the method comprising:

providing a semiconductor package which includes a package substrate having a plurality of conductive traces, a semiconductor attached to a die attach area on an upper surface of the package substrate, electrical connections between the die and the conductive traces, and at least one substrate strap which connects the package substrate to a package frame;

placing the semiconductor package into a lower mold having a recess for holding the package substrate, a frame channel for holding the substrate frame, the frame channel being formed outside the recess, and a substrate strap channel for holding a substrate strap, the substrate strap channel joining the recess and the frame channel;

joining the lower mold to an upper mold, the upper mold having cavity formed therein which mates with the recess in the lower mold to create a mold body cavity over the upper surface and side edges of the package substrate and a runner channel which provides a flow path to transfer a molding material from a material cavity to the mold body cavity;

transferring the molding material through the runner channel and into the mold body cavity;

curing the molding material in the mold body cavity;

removing the semiconductor package from the upper and lower molds after the molding material is cured.

13. A method as in claim 12 wherein the step of transferring the molding material comprises placing the molding material in the material cavity and inserting a transfer ram into the material cavity.

14. A method as in claim 12 wherein the step of transferring the molding material comprises injecting the molding material into the mold body cavity.

15. A method as in claim 12 further comprising the step of removing molding material cured in the runner channel from the semiconductor package.

16. A method as in claim 15 further comprising the step of singulating the semiconductor package from a strip of semiconductor packages.

17. A method as in claim 16 wherein the step of singulating the semiconductor package comprises severing the substrate strap.

18. A method as in claim 17 further comprising the step of scoring the substrate strap before it is severed.

* * * * *